(12) United States Patent
Eberler et al.

(10) Patent No.: US 8,779,774 B2
(45) Date of Patent: Jul. 15, 2014

(54) MAGNETIC RESONANCE ANTENNA AND A MAGNETIC RESONANCE DEVICE HAVING A MAGNETIC RESONANCE ANTENNA

(75) Inventors: Ludwig Eberler, Neumarkt i.d.OPf. (DE); Razvan Lazar, Erlangen (DE); Jürgen Nistler, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 453 days.

(21) Appl. No.: 13/253,066

(22) Filed: Oct. 5, 2011

(65) Prior Publication Data

US 2012/0086451 A1 Apr. 12, 2012

(30) Foreign Application Priority Data

Oct. 5, 2010 (DE) .......................... 10 2010 041 984

(51) Int. Cl.
*G01V 3/00* (2006.01)
(52) U.S. Cl.
USPC .......................................... 324/322; 324/307
(58) Field of Classification Search
USPC ............................. 324/300–322; 600/409–445
See application file for complete search history.

(56) References Cited

U.S. PATENT DOCUMENTS

| | | | |
|---|---|---|---|
| 5,144,240 A | | 9/1992 | Mehdizadeh et al. |
| 6,711,430 B1 * | | 3/2004 | Ferris et al. .................. 600/417 |
| 6,873,156 B2 * | | 3/2005 | Ferris et al. .................. 324/318 |
| 6,898,454 B2 * | | 5/2005 | Atalar et al. .................. 600/410 |
| 6,943,551 B2 * | | 9/2005 | Eberler et al. ................ 324/318 |
| 7,068,035 B2 * | | 6/2006 | Nistler et al. ................. 324/322 |
| 7,522,952 B2 * | | 4/2009 | Krieg et al. ................... 600/411 |
| 7,599,729 B2 * | | 10/2009 | Atalar et al. .................. 600/423 |
| 7,639,011 B2 * | | 12/2009 | Candidus et al. ............. 324/318 |

(Continued)

FOREIGN PATENT DOCUMENTS

| DE | 10 2007 016 312 A1 | 10/2008 |
|---|---|---|
| DE | 10 2009 023 806 A1 | 1/2010 |

(Continued)

OTHER PUBLICATIONS

German Office Action dated Jun. 28, 2011 for corresponding German Patent Application No. DE 10 2010 041 984.2 with English translation.

*Primary Examiner* — Brij Shrivastav
(74) *Attorney, Agent, or Firm* — Lempia Summerfield Katz LLC

(57) ABSTRACT

The present embodiments include a magnetic resonance antenna having parallel-running longitudinal antenna rods arranged in a birdcage structure and antenna ferrules connecting the parallel-running longitudinal antenna rods at ends of the parallel-running longitudinal antenna rods in radio frequency terms. The magnetic resonance antenna includes a plurality of radio-frequency switching elements configured to interrupt at least a part of the parallel-running longitudinal antenna rods to detune a natural resonance frequency with respect to an operating magnetic resonance frequency in radio frequency terms. At least some radio-frequency switching elements of the plurality of radio-frequency switching elements are arranged at end sections of the parallel-running longitudinal antenna rods.

20 Claims, 4 Drawing Sheets

(56) References Cited

U.S. PATENT DOCUMENTS

| | | |
|---|---|---|
| 7,936,170 B2 | 5/2011 | Saha et al. |
| 7,990,146 B2 | 8/2011 | Lazar et al. |
| 8,063,636 B2 * | 11/2011 | Hyde et al. .................... 324/309 |
| 8,148,986 B2 * | 4/2012 | Driesel et al. ................ 324/318 |
| 8,237,442 B2 * | 8/2012 | Lazar et al. .................. 324/318 |
| 8,392,218 B2 * | 3/2013 | Becker et al. ..................... 705/3 |
| 8,581,588 B2 * | 11/2013 | Driesel et al. ................ 324/322 |
| 2009/0015256 A1 * | 1/2009 | Bottomley et al. ........... 324/309 |
| 2010/0010337 A1 | 1/2010 | Hagen et al. |
| 2010/0188086 A1 | 7/2010 | Lazar et al. |
| 2011/0237859 A1 * | 9/2011 | Kuhn et al. ....................... 600/1 |

FOREIGN PATENT DOCUMENTS

| | | |
|---|---|---|
| DE | 10 2009 026 316 A1 | 2/2010 |
| DE | 10 2008 062 547 A1 | 7/2010 |
| EP | 2 062 032 B1 | 6/2010 |

* cited by examiner

MAGNETIC RESONANCE ANTENNA AND A MAGNETIC RESONANCE DEVICE HAVING A MAGNETIC RESONANCE ANTENNA

This application claims the benefit of DE 10 2010 041 984.2, filed on Oct. 5, 2011.

BACKGROUND

The present embodiments relate to a magnetic resonance antenna.

Magnetic resonance devices may operate with a plurality of different antennas (e.g., coils) for emitting radio-frequency pulses for the purpose of exciting nuclear magnetic resonance and/or for receiving induced magnetic resonance signals. A magnetic resonance device may include a relatively large, permanently installed coil (e.g., a whole-body coil) and a plurality of small local coils (e.g., surface coils). In contrast to the whole-body coil, the local coils serve to provide detailed imaging of parts of the body and/or organs of a patient that are located relatively close to the surface of the body. The local coils are applied directly at a region of the patient that is to be examined.

When such a local coil is used, radio-frequency pulses may be transmitted using the whole-body coil permanently installed in the magnetic resonance device, and the induced magnetic resonance signals are received using the local coil. In order to enable an interaction between the individual coils to be suppressed, the receive coil may be detuned in the transmit phase, and the transmit coil may be detuned in the receive phase. Detuning entails shifting a natural resonance frequency of the respective coil or antenna in such a way that the shifted resonance frequency lies outside a range of an operating magnetic resonance frequency. An antenna detuned in this manner ideally behaves neutrally, with the result that the antenna is transparent to the radio-frequency pulses emitted by the other coil and/or to the induced magnetic resonance signals.

Magnetic resonance antennas having a birdcage structure are widely used as a whole-body coil. Such an antenna has a plurality of parallel-running longitudinal antenna rods arranged on a cylinder-like surface. The parallel-running longitudinal antenna rods are interconnected in radio-frequency terms at ends of the parallel-running longitudinal antenna using antenna ferrules or rings. The longitudinal antenna rods and antenna ferrules may be embodied in an arbitrary shape. The longitudinal antenna rods and antenna ferrules may be formed, for example, by conductor tracks that may be applied on a flexible conductor track foil and arranged in a cylinder shape around a measurement space, in which an examination subject is contained during an examination. In the case of a whole-body coil, for example, the birdcage structure encloses a patient-receiving chamber, in which a patient is positioned during a measurement.

An antenna having a birdcage structure may be detuned by detuning the antenna ferrules, the longitudinal antenna rods, or both. In such a detuning process, a resonant inductance is interrupted or a resonant capacitance bridged and/or short-circuited, for example, using a suitable radio-frequency switching element.

It is known from U.S. Pat. No. 6,943,551 that radio-frequency switching elements are used in order to detune radio-frequency switching elements inside a magnetic resonance antenna, the radio-frequency switching elements being arranged in a region of a geometric center along a length of longitudinal antenna rods of the magnetic resonance antenna.

It is also known that a transformation of a short-circuit via radio-frequency feed cables to an antenna ferrule is effected in order to detune the natural resonance of the magnetic resonance antenna.

SUMMARY AND DESCRIPTION

The known measures for detuning a magnetic resonance antenna are unsuitable for detuning the magnetic resonance antenna in high-field imaging with a magnetic field of greater than or equal to 3 Tesla and/or where a magnetic resonance device is combined with a PET device.

The present embodiments may obviate one or more of the drawbacks or limitations in the related art. For example, effective detuning of a magnetic resonance antenna for high-field imaging may be provided.

The present embodiments include a magnetic resonance antenna having parallel-running longitudinal antenna rods arranged in a birdcage structure and antenna ferrules connecting the longitudinal antenna rods at ends of the parallel-running longitudinal antenna rods in radio frequency terms. The magnetic resonance antenna includes a plurality of radio-frequency switching elements in order to interrupt at least a part of the longitudinal antenna rods for the purpose of detuning a natural resonance frequency with respect to an operating magnetic resonance frequency in radio frequency terms.

At least some of the radio-frequency switching elements are arranged at end sections of the longitudinal antenna rods. An end section of the longitudinal antenna rods may be, for example, a section of the longitudinal antenna rods facing the antenna ferrules. "Radio frequency terms" may be understood that a connection exists that is transparent to radio-frequency currents (e.g., between the antenna ferrules and the longitudinal antenna rods and/or between the individual antenna end rods). The connection that is transparent to radio-frequency currents may be configured as insulating and/or non-conducting with respect to an electric current (e.g., using an electrically isolated connection), or the connection may be configured as conducting. In one embodiment, the radio-frequency switching element is foamed by a PIN diode. Using the present embodiments, an area that is disposed between end sections along a longitudinal direction of the longitudinal antenna rods may advantageously be kept free of components, and the area may be kept free of currents that may adversely affect a main magnetic field that is being applied. This has an advantageous effect in cases where magnetic resonance imaging is implemented in combination with a positron emission tomography (PET) system, since components that may have a disrupting influence on the PET application (e.g., in the form of an unwanted attenuation of PET signals) are arranged outside of an angle of view or field of view of the PET system. For high-field imaging in a magnetic field range of greater than and/or equal to 3 Tesla, for space and/or symmetry reasons, the radio-frequency switching elements provided for detuning purposes are arranged on the longitudinal antenna rods at the end sections of the longitudinal antenna rods. In high-field imaging, the birdcage structure is to be arranged in a bandpass structure on account of very high frequencies. In such an arrangement, the longitudinal antenna rods may be interrupted a number of times using switching elements (e.g., capacitors). At least some of the switching elements are arranged in a central area of the longitudinal antenna rods.

The longitudinal antenna rods each have at least two conductor elements running in parallel, as a result of which eddy currents resulting within the longitudinal antenna rods due to gradient fields may advantageously be at least partially suppressed and/or attenuated. "Conductor elements running in parallel" may be that the conductor elements run parallel to one another along a longitudinal direction of the longitudinal antenna rods. For this purpose, the longitudinal antenna rods may be formed, for example, from a copper sheet that has at least one groove (e.g., a plurality of grooves) extending along the longitudinal extension and subdividing the longitudinal antenna rods into at least two conductor elements running in parallel.

In one embodiment, at least some of the radio-frequency switching elements are arranged at end sections of the parallel-running conductor elements, thereby enabling precise control of the individual radio-frequency switching elements to be achieved. For detuning the natural frequencies in the longitudinal antenna rods, all of the parallel-running conductor elements of a longitudinal antenna rod may not be provided with radio-frequency switching elements at the end sections; for example, only two out of four parallel-running conductor elements of a longitudinal antenna rod may be provided with the radio-frequency switching elements. Therefore, a remaining rod cross-section is significantly altered, such that a change in the resulting inductance of the longitudinal antenna rods is sufficient to achieve effective separation of a natural resonance frequency of the magnetic resonance antenna from the operating magnetic resonance frequency.

In one embodiment, the radio-frequency switching elements are arranged at only one end section of the longitudinal antenna rods, and the end sections are arranged on the longitudinal antenna rods so as to be facing a first antenna ferrule. A space-saving arrangement and, for example, a space-saving control of the radio-frequency switching elements within the longitudinal antenna rods or within the magnetic resonance antenna may advantageously be achieved.

In another embodiment, the magnetic resonance antenna has at least one common supply unit that is provided for supplying and/or controlling the radio-frequency switching elements of at least two longitudinal antenna rods. A compact and space-saving supply and/or control of the different longitudinal antenna rods may be achieved in this way. In one embodiment, the supply unit is arranged outside an area of the magnetic resonance antenna that is disposed between the two antenna ferrules. In addition, the supply unit may be arranged in an area, in which a radio-frequency feeder unit of the magnetic resonance antenna is also arranged, thereby enabling a space-saving and compact arrangement of the supply unit inside the magnetic resonance antenna to be achieved. In one embodiment, the supply unit is arranged substantially parallel to at least one of the antenna ferrules.

If, in addition, the supply unit has a circuit board including at least two conductive layers, the different longitudinal antenna rods may be provided with a current feed (e.g., a feed of direct current) for controlling and/or supplying the radio-frequency switching elements, and a current return that are separated from one another. In one embodiment, a cross-section of the circuit board is configured such that lines for the feeding and return of all longitudinal antenna rods supplied by the supply unit and/or connected to the longitudinal antenna rods may be provided.

Control of the radio-frequency switching elements in the individual longitudinal antenna rods may be achieved if the supply unit for controlling and/or supplying at least one radio-frequency switching unit has at least one inductive switching element. The supply unit may have two inductive switching elements for controlling and/or supplying a radio-frequency switching unit. A current feed for controlling and/or supplying the radio-frequency switching elements is provided using one of the inductive switching elements, and a current return from the radio-frequency switching elements is provided using the other of the two inductive switching elements. If, in addition, at least one inductive switching element (e.g., two inductive switching elements) is provided for controlling and/or supplying the radio-frequency switching elements for each of the radio-frequency switching elements of the magnetic resonance antenna, a substantially uniform current distribution to the radio-frequency switching elements may also be achieved owing to a high ohmic resistance of the inductive switching elements (e.g., approximately $1\Omega$ to $3\Omega$). A thermal displacement of semiconductor components may be reduced using the inductive switching elements. The inductive switching element may be formed by a choke coil. Alternatively or in addition to an embodiment of the inductive switching element as a choke coil, other embodiments and/or developments of the inductive switching elements are possible.

An undesirable degradation of an application (e.g., a PET application), for example, in the form of an unwanted attenuation of PET signals, may be prevented if the at least one inductive switching element is arranged outside an area that is disposed between the two antenna ferrules.

In one embodiment, the supply unit has at least one line that is routed from the at least one inductive switching element to the longitudinal antenna rod over and/or under at least one of the antenna ferrules. A configuration for controlling and/or supplying the radio-frequency switching elements that, for example, is independent of a connection between the longitudinal antenna rods and the antenna ferrules (e.g., of a connection between individual conductor elements of the longitudinal antenna rods and the antenna ferrules) may be realized. For example, in spite of an interruption of a current-conducting connection within the longitudinal antenna rods or the conductor elements (e.g., by additional switching elements such as capacitors arranged on the conductor elements), a control and/or supply of the radio-frequency switching elements may be achieved by, for example, line bridging the interruption and coupling to the longitudinal antenna rods only in an area following the interruption. "Routed over and/or under the antenna ferrule" may be that the lines for the radio-frequency switching elements are routed past the antenna ferrule without, in the process, being in electrically conducting contact with the antenna ferrule.

In one embodiment, the supply unit has at least one line that runs to the longitudinal antenna rod from the at least one inductive switching element through at least one antenna ferrule at least partly electrically connected to the longitudinal antenna rod. While saving on additional components, a direct line may be realized via the antenna ferrule and the longitudinal antenna rod (e.g., via the individual conductor elements), up to the radio-frequency switching elements. An electrical connection may be, for example, a current-conducting connection.

In another embodiment, the magnetic resonance antenna has at least two supply units for supplying and/or controlling all the radio-frequency switching elements arranged on the longitudinal antenna rods. Using the at least two supply units, an interruption of an annular supply for the radio-frequency switching elements that is arranged outside of the antenna ferrules may be achieved. The interruption may advantageously be used for implementing a radio-frequency supply of the magnetic resonance antenna (e.g., the antenna ferrules and/or the longitudinal antenna rods). The supply units for supplying and/or controlling the radio-frequency switching elements may be disposed together with the radio-frequency supply for the magnetic resonance antenna in a particularly space-saving and compact arrangement.

If the at least two supply units have a common connection unit for a voltage connection, a number of terminals and/or connecting lines that are arranged, for example, in proximity to components of the magnetic resonance antenna that are emitting a radio-frequency field may advantageously be minimized. As a result, a negative degradation of the radio-frequency field and/or of a main magnetic field may be suppressed. This may have an advantageous effect in the field of multinuclear spectroscopy.

The connection unit has at least one choke element, thereby enabling a coupling-in of radio-frequency signals (e.g., onto the components of the magnetic resonance antenna emitting the radio-frequency field) to be advantageously reduced and/or suppressed and in addition, a direct-current signal for supplying and/or controlling the radio-frequency switching elements advantageously to pass the choke element simultaneously. A choke element may be understood, for example, to be an element that is formed by an inductive component (e.g., a passive component) and/or a switching element (e.g., a choke coil) and/or has a function of a choke coil such as, for example, a standing wave trap and/or further components and/or switching elements useful to the person skilled in the art.

In one embodiment, at least one of the longitudinal antenna rods has at least one further switching element, so that eddy currents induced within the longitudinal antenna rods may be reduced or almost completely suppressed. The at least one switching element arranged on a conductor element or a plurality of switching elements of the longitudinal antenna rod are each arranged on one conductor element of the longitudinal antenna rod. The at least one further switching element may be formed by a capacitive element (e.g., a capacitor).

A space-saving arrangement within the longitudinal antenna rods may be achieved if the at least one further switching element and the radio-frequency switching elements are arranged at different end sections of the longitudinal antenna rod.

The line inside the longitudinal antenna rods branches off ahead of the end section containing the further switching elements to the supply unit. An interruption of the longitudinal antenna rods (e.g., of the individual conductor elements) caused on account of the further switching element may advantageously be bridged for the purpose of controlling and/or supplying the radio-frequency switching units.

The present embodiments also include a magnetic resonance device having one embodiment of a magnetic resonance antenna described above.

One embodiment of a combination of a PET system and a magnetic resonance device includes one embodiment a magnetic resonance antenna as described above.

DETAILED DESCRIPTION OF THE DRAWINGS

Figure 1:
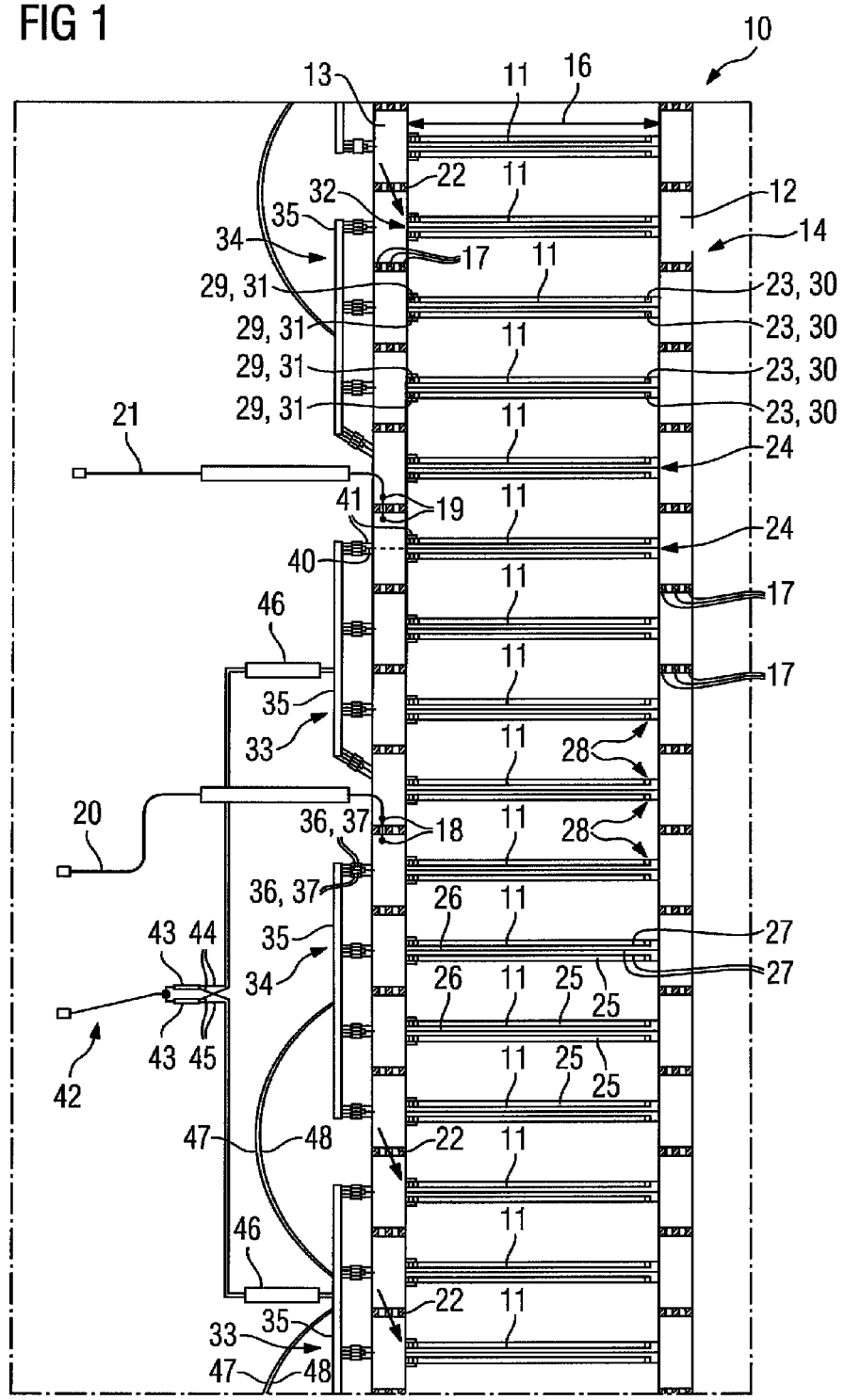
FIG. 1 shows a sectional view of one embodiment of a magnetic resonance antenna.
Figure 2:
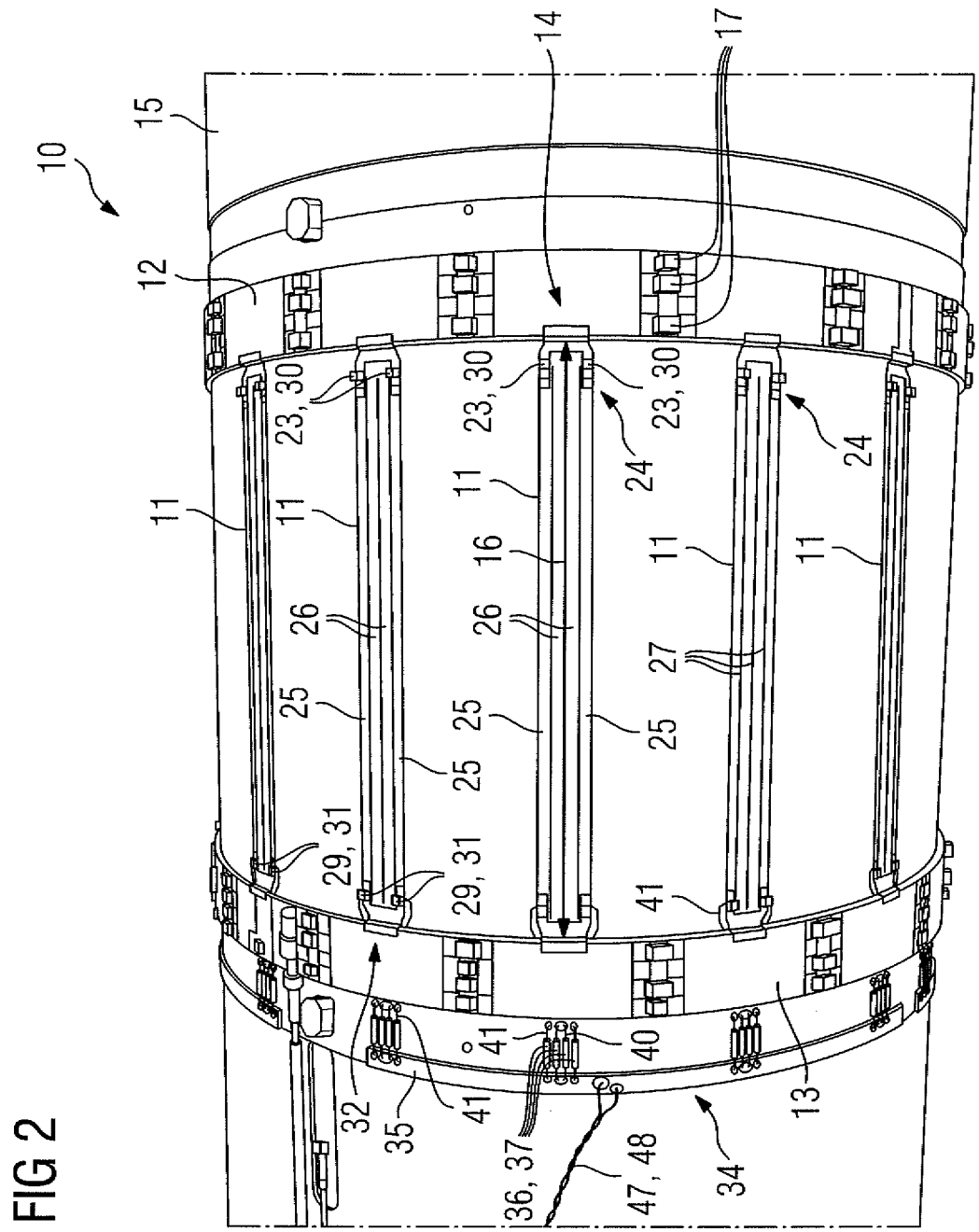
FIG. 2 shows another view of one embodiment of the magnetic resonance antenna.
Figure 3:
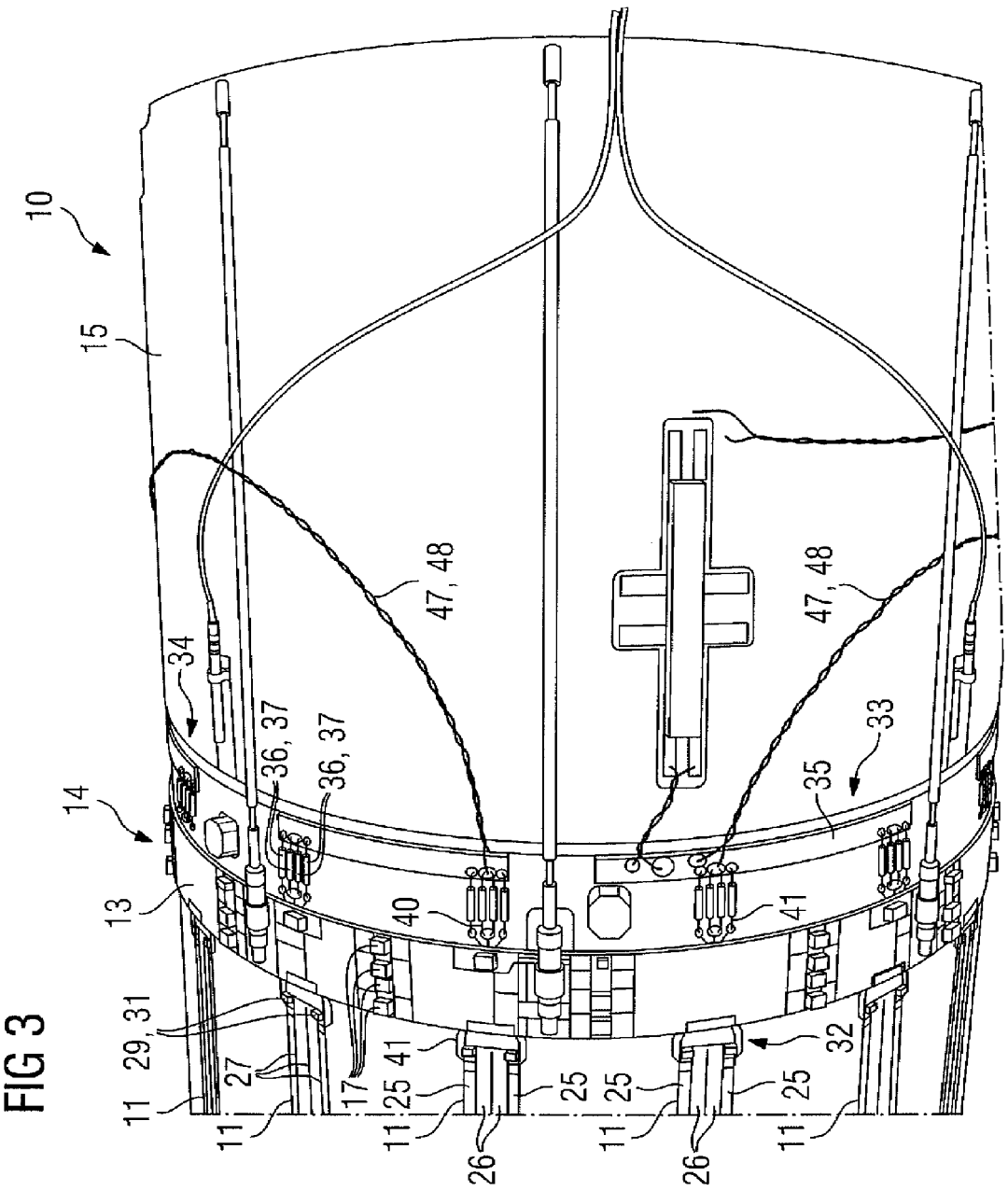
FIG. 3 shows one embodiment of the magnetic resonance antenna in an area of supply units.

FIGS. 1 to 3 show a magnetic resonance antenna 10 according to the present embodiments. In these exemplary embodiments, the magnetic resonance antenna 10 is formed by a cylinder-shaped whole-body antenna and in FIG. 1 is shown in a sectional plan view. In an alternative embodiment, the magnetic resonance antenna 10 may be formed by a local antenna.

The magnetic resonance antenna 10 has a plurality of longitudinal antenna rods 11 and two antenna ferrules 12, 13 that are arranged in a birdcage structure 14 of the magnetic resonance antenna 10. In one embodiment, the magnetic resonance antenna 10 has sixteen longitudinal antenna rods 11, though the number of longitudinal antenna rods 11 may vary depending on the embodiment of the magnetic resonance antenna 10. The longitudinal antenna rods 11 are formed, for example, by 18 μm-thick copper conductor strips. The two antenna ferrules 12, 13 have copper conducting strips that are applied on a flexible conductor track foil and are arranged cylindrically around an examination space for receiving a patient. In this arrangement, the longitudinal antenna rods 11 are disposed equidistantly and parallel to one another, the longitudinal antenna rods 11 being arranged on a cylinder-shaped carrier element 15 formed, for example, from a glass-fiber-reinforced plastic (see FIGS. 2 and 3). In addition, the longitudinal antenna rods 11 are connected to one another in radio-frequency terms on both sides along longitudinal extensions 16 at ends using the two antenna ferrules 12, 13.

Between individual connection points of longitudinal antenna rods 11 directly adjacent to one another, the two antenna ferrules 12, 13 each have capacitors 17 that are embodied as resonant capacitors. One of the two antenna ferrules 12 has two connection elements 18, 19, using which the magnetic resonance antenna 10 is connected via feed lines 20, 21 to a radio-frequency pulse generator that is not shown in more detail. The two feed lines 20, 21 are each connected on the right and left next to one of the resonant capacitors 17. Via the feed lines 20, 21, radio-frequency pulses are injected in a transmit mode of the magnetic resonance antenna 10, while magnetic resonance signals are tapped in a receive mode. Three of the resonant capacitors 22 are also implemented as adjustable to allow a fine adjustment of a resonant frequency of the magnetic resonance antenna 10. The three resonant capacitors 22 are arranged on the antenna ferrule 13 having the connection elements 18, 19.

To achieve a detuning of a natural resonance frequency with respect to an operating magnetic resonance frequency, the magnetic resonance antenna 10 has a plurality of radio-frequency switching elements 23, each radio-frequency switching element of the plurality of radio-frequency switching elements being formed by a PIN diode 30. The PIN diodes 30 are each arranged at an end section 24 of the longitudinal antenna rods 11. All of the PIN diodes 30 are arranged at the end sections 24 facing the antenna ferrule 13, which faces away from the antenna ferrule 12 with the connection elements 18, 19, of the longitudinal antenna rods 11. Each of the longitudinal antenna rods 11 has conductor elements 25, 26 for suppressing eddy currents induced in the longitudinal antenna rods 11, the conductor elements 25, 26 being arranged parallel to one another along the longitudinal direction 16 of the longitudinal antenna rods 11. The conductor elements 25, 26 are formed, for example, as a result of groove-shaped cutouts 27 arranged in the copper conductor element, such that the individual conductor elements 25, 26 are separated from one another by the groove-shaped cutouts 27. Each of the longitudinal antenna rods 11 has four conductor elements 25, 26, one PIN diode 30 being arranged at an end section 28 of each of the conductor elements 25 on two of the four conductor elements 25. The PIN diodes 30 are arranged at each of the two outer conductor elements 25 of the four conductor elements 25 arranged adjacent to one another.

The arrangement of the PIN diodes 30 on two of the four conductor elements 25 of the longitudinal antenna rods 11 effects a change in inductance in the longitudinal antenna rods 11 due to a change in an effective rod cross-section. As a result, there is also a change in a natural resonance frequency of the longitudinal antenna rods 11, such that the longitudinal antenna rods may be decoupled, separated, or decoupled and separated from an operating magnetic resonance frequency. Owing to the arrangement of the PIN diodes 30 at the end sections 24, a central area of the birdcage structure 14 may be kept free of electric currents and consequently an undesirable degradation of a main magnetic field, in which the magnetic resonance antenna 10 is arranged, may be prevented.

Also arranged on the longitudinal antenna rods 11 are further switching elements 29 of the magnetic resonance antenna 10. The further switching elements 29 are formed by capacitors that are embodied as blocking capacitors 31. Two blocking capacitors 31 are arranged on each of the longitudinal antenna rods 11. Each of the two blocking capacitors 31 is arranged at an end section 32 of the conductor elements 25 facing away from the PIN diodes 30. The blocking capacitors 31 are arranged on the outer conductor elements 25 of each of the longitudinal antenna rods 11. The conductor elements 25 are interrupted using the blocking capacitors 31 with the result that an electrical connection from the two conductor elements 25 to the antenna ferrule 12 is also interrupted. Using the interruptions of the conductor elements 25 or using the blocking capacitors 31, eddy currents induced within the longitudinal antenna rods 11 may advantageously be reduced and/or suppressed.

For the purpose of supplying and/or controlling the PIN diodes 20, the magnetic resonance antenna 10 has four supply units 33, 34. All of the PIN diodes 31 arranged on four adjacently arranged longitudinal antenna rods 11 are supplied and/or controlled using one of the four supply units 33, 34. In an alternative embodiment, the number of supply units 33, 34 may vary and/or be adjusted to match a changed embodiment of the birdcage structure 14. In addition, a number of PIN diodes 31 controlled and/or supplied by a supply unit 33, 34 may also be varied. Advantageously, however, the magnetic resonance antenna 10 has at least two supply units 33, 34, so that a space between the at least two supply units 33, 34 may be used for the feed lines 20, 21 to the antenna ferrules 12.

The supply units 33, 34 are arranged outside an area enclosed between the two antenna ferrules 12, 13 and disposed in a space-saving manner next to the birdcage structure 14 on a side of the birdcage structure 14 facing the feed lines 20, 21. In this arrangement, the feed lines 20, 21 are each routed in an area between two supply units 33, 34 up to the antenna ferrule 12.

The supply units 33, 34 each have a circuit board 35 having at least two conducting layers. A first conducting layer of the circuit board 35 is configured for feeding direct current for supplying and/or controlling the PIN diodes 30, and a second conducting layer of the circuit board 35 is configured for a direct current return. The supply units 33, 34 have two inductive switching elements 36 for each PIN diode 30 controlled and/or supplied by the supply unit 33, 34. Each of the inductive switching elements is formed by a choke coil 37. Direct current is fed to the PIN diode 30 via a first of the two choke coils 37, and the direct current return takes place via a second of the two choke coils 37. In the present exemplary embodiment, four choke coils 37 are available for the two PIN diodes 20 arranged on a longitudinal antenna rod 11. In an alternative embodiment, one choke coil 37 may be configured for the direct current supply and/or return of at least two PIN diodes 30.

The choke coils 37 for the direct current feed are connected to the first layer of the respective circuit board 35, and the choke coil 37 for the direct current return are connected to the second layer of the respective circuit board 35. The four choke coils 37 for supplying and/or controlling the PIN diodes 20 arranged on a longitudinal antenna rod 11 are arranged parallel to one another outside the birdcage structure 14 or outside the area disposed between the two antenna ferrules 12, 13. Owing to high ohmic resistance, which may be in a range of approximately $1\Omega$ to $3\Omega$, the choke coils 37 cause the direct current routed by the supply units 33, 34 in the direction of the PIN diodes 30 during operation of the magnetic resonance antenna 10 to be distributed evenly, with the result that a direct current that is substantially the same is present at all the PIN diodes 30. The PIN diodes 30 act as lowpass filters, with the result that a radio-frequency connection between the longitudinal antenna rods 11 and/or the antenna ferrule 12 and the supply units 33, 34 is disabled. Since both the feed and the return of direct current to and from the PIN diodes 30 are realized using the choke coils 37, a radio-frequency influence of the direct current supply to the PIN diodes 30 on a resonant structure or on the birdcage structure 14 of the magnetic resonance antenna 10 during the operation of the magnetic resonance antenna 10 is minimized, and the direct current supply of the PIN diodes 30 is virtually decoupled from the resonant structure.

A feed and return of the direct current from the choke coils 37 to the longitudinal antenna rods 11 and back takes place via lines 40, 41 of the supply units 33, 34. The feed for the line 40 is effected via the antenna ferrule 12, the ferrule 12 being electrically connected to the two middle conductor elements 26 of the longitudinal antenna rods 11. The lines 41 provided for the return are connected directly to the two outer conductor elements 25 of the longitudinal antenna rods 11, a connection point along a direction from the PIN diodes 30 to the blocking capacitors 31 being provided ahead of the blocking capacitors 31 such that no further interruption of the conductor elements 26 is present between the connection points and the PIN diodes 30. During the operation of the magnetic resonance antenna 10, a direct current for each of the PIN diodes 30 is routed via the choke coil 37 provided for the feed and from the choke coil 37, via the antenna ferrule 12 and one of the middle conductor elements 25 of the respective longitudinal antenna rod 11 to the PIN diode 30. For this purpose, the conductor elements 25, 26 of the longitudinal antenna rods 11 at the end section 28 having the PIN diode 30 are conductively or electrically connected to one another. From the PIN diode 30, a return of the direct current is effected along the outer conductor elements 26 having the PIN diode 30 in the direction of the connection point and from the outer conductor elements 26, via the line 41 to the choke coil 37.

The four supply units 33, 34 have a common connection unit 42 for a voltage connection. For this purpose, one of the four supply units 33 is connected in a current-conducting manner or electrically to the two adjacent supply units 34 using direct-current voltage lines 47, 48. A fourth of the supply units 33 and one of the three supply units 33 are in each case connected at the common connection unit 42. The connection unit 42 has choke elements 43 that have a function for suppressing a coupling-in of radio-frequency signals. Two direct-current voltage lines 44 for feeding the direct current are brought together at the choke elements 34, and the two direct-current voltage lines 45 are brought together for the purpose of returning the direct current. Arranged between each of the two supply units 33 and a convergence point of the direct-current voltage lines 44, 45 is a further switching element that is formed by a standing wave trap 46. The standing wave traps 46 have a mode of operation similar to choke elements, so a coupling-in of radio-frequency signals is prevented using the standing wave traps 46.

The direct-current voltage lines 44, 45, 47, 48 for the feed and return of direct current are arranged close to one another in order to suppress unwanted distortions of a static main magnetic field within an examination region or a field of view of the magnetic resonance antenna 10. During operation of the magnetic resonance antenna 10, each of the direct-current voltage lines 44, 45, 47, 48 for the direct current feed and return generates a magnetic field, the two magnetic fields of the feed and return lines being oppositely directed with respect to each other. The closer the two direct-current lines 44, 45, 47, 48 are arranged to the examination region or the field of view within the magnetic resonance antenna 10, the stronger is the effect of the two magnetic fields on the main magnetic field, and the two magnetic fields may lead to undesirable distortions. This effect may be at least partly counteracted by arranging the two direct-current lines 44, 45, 47, 48 for feeding and returning direct current as close as possible next to one another, whereby the two magnetic fields at least partly counterbalance each other. A distance between the two direct-current voltage lines 44, 45, 47, 48 for the direct current feed and return is 2 to 3 cm at maximum, for example. In one embodiment, the distance between the two direct-current lines 44, 45, 47, 48 is less than 1 cm. The two direct-current lines 44, 45, 47, 48 for the direct current feed and return may also be twisted together, as shown in FIGS. 2 and 3, with the result that the two magnetic fields induced by the two direct-current lines 44, 45, 47, 48 substantially compensate each other and/or lead to a small residual magnetic field. This relates both to the direct-current voltage lines 47, 48 between the individual supply units 33, 34 and the direct-current voltage lines 44, 45 between the supply units 33 and the common connection unit 43.

With respect to function, the present embodiments provide both an extremely effective and, in manufacturing terms, low-cost solution to the detuning problem associated with a magnetic resonance antenna 10 implemented in a birdcage structure 14 at higher magnetic field strengths. The direct current signals used for the detuning are routed through a radio-frequency-active region of the birdcage structure 14 without interfering with the radio-frequency functionality.

The present embodiments are not limited to the above-described exemplary embodiments. In an alternative embodiment, for example, all the conductor elements 25, 26 may be provided with one radio-frequency switching element 23. Although the present embodiments have been mainly described with reference to the example of magnetic resonance devices in the medical domain, the potential applications are not restricted to this domain. Rather the present embodiments may also be used in scientific and/or industrial installations.

Figure 4:
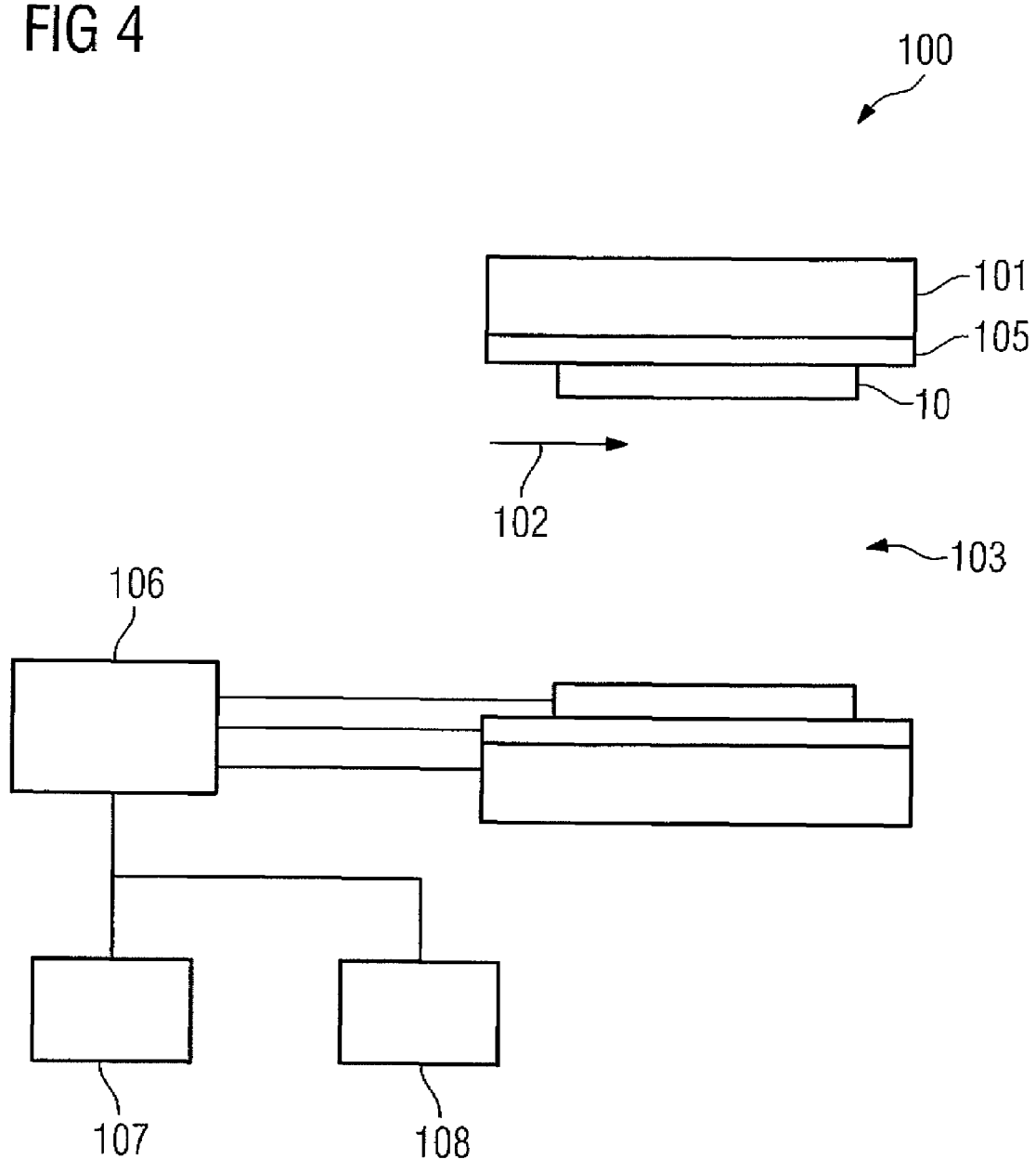
FIG. 4 shows one embodiment of a magnetic resonance device with a magnetic resonance antenna.

FIG. 4 shows one embodiment of a magnetic resonance device 100 that includes the magnetic resonance antenna 10. The magnetic resonance device 100 includes a main magnet 101 for generating a main magnetic field 102. In addition, the magnetic resonance device 100 has a cylinder-shaped receiving area 103 for accommodating a patient, the main magnet 101 being arranged cylindrically around the receiving area 103. Also arranged between the receiving area 103 and the main magnet 101 are gradient coils 105 of the magnetic resonance device 100. The gradient coils 105 are provided for the purpose of generating magnetic field gradients. The magnetic resonance antenna 10 is additionally arranged between the receiving area 103 and the gradient coils 105 for the purpose of exciting a polarization that establishes in a steady state in the main magnetic field 102 generated by the main magnet 101.

The magnetic resonance device 100 has a control unit 106 in order to control the main magnet 101, the gradient unit 105 and the magnetic resonance antenna 10. Control information such as imaging parameters, for example, and reconstructed magnetic resonance images may be displayed on a display unit 107 of the magnetic resonance device 100. In addition, the magnetic resonance device 100 has an input unit 108, using which information and/or parameters may be entered by an operator during a measurement operation.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance antenna comprising:
    parallel-running longitudinal antenna rods arranged in a birdcage structure; antenna ferrules connecting the parallel-running longitudinal antenna rods at ends of the parallel-running longitudinal antenna rods in radio frequency terms; and
    a plurality of radio-frequency switching elements configured to interrupt at least a part of the parallel-running longitudinal antenna rods to detune a natural resonance frequency with respect to an operating magnetic resonance frequency in radio frequency terms,
    wherein one or more radio-frequency switching elements of the plurality of radio-frequency switching elements are arranged at end sections of the parallel-running longitudinal antenna rods.

2. The magnetic resonance antenna as claimed in claim 1, wherein each of the parallel-running longitudinal antenna rods have at least two conductor elements running in parallel.

3. The magnetic resonance antenna as claimed in claim 2, wherein at least some radio frequency switching elements of the plurality of radio-frequency switching elements are arranged at end sections of the at least two conductor elements running in parallel.

4. The magnetic resonance antenna as claimed in claim 1, wherein the plurality of radio-frequency switching elements is arranged at only one end section of the parallel-running longitudinal antenna rods, and
    wherein the one end section is arranged on the parallel-running longitudinal antenna rods facing a first antenna ferrule.

5. The magnetic resonance antenna as claimed in claim 1, wherein at least one common supply unit is provided for supplying, controlling, or supplying and controlling radio-frequency switching elements of at least two of the parallel-running longitudinal antenna rods, the plurality of radio-frequency switching elements comprising the radio-frequency switching elements.

6. The magnetic resonance antenna as claimed in claim 5, wherein the at least one common supply unit has a circuit board comprising at least two conducting layers.

7. The magnetic resonance antenna as claimed in claim 5, wherein the at least one common supply unit has at least one inductive switching element configured for controlling, supplying, or controlling and supplying at least one radio-frequency switching element of the plurality of radio-frequency switching elements.

8. The magnetic resonance antenna as claimed in claim 7, wherein the at least one inductive switching element is arranged outside an area disposed between two of the antenna ferrules.

9. The magnetic resonance antenna as claimed in claim 7, wherein the at least one common supply unit has at least one line that is routed from the at least one inductive switching element to one of the at least two longitudinal antenna rods over, under, or over and under at least one of the antenna ferrules.

10. The magnetic resonance antenna as claimed in claim 7, wherein the at least one inductive switching element is at least partly electrically connected to one of the at least two longitudinal antenna rods through at least one of the antenna ferrules.

11. The magnetic resonance antenna as claimed in claim 1, further comprising at least two supply units configured for supplying, controlling, or supplying and controlling all radio-frequency switching elements of the plurality of radio-frequency switching elements arranged on the parallel-running longitudinal antenna rods.

12. The magnetic resonance antenna as claimed in claim 11, wherein the at least two supply units have a common connection unit for a voltage connection.

13. The magnetic resonance antenna as claimed in claim 12, wherein the common connection unit has at least one choke element.

14. The magnetic resonance antenna as claimed in claim 1, wherein at least one of the parallel-running longitudinal antenna rods has at least one further switching element.

15. The magnetic resonance antenna as claimed in claim 14, wherein the at least one further switching element and the plurality of radio-frequency switching elements are arranged at different end sections of the at least one parallel-running longitudinal antenna rod.

16. The magnetic resonance antenna as claimed in claim 14, wherein at least one common supply unit is provided for supplying, controlling, or supplying and controlling radio-frequency switching elements of at least two of the parallel-running longitudinal antenna rods, the plurality of radio-frequency switching elements comprising the radio-frequency switching elements,
wherein the at least one common supply unit has at least one inductive switching element configured for controlling, supplying, or controlling and supplying at least one radio-frequency switching element of the plurality of radio-frequency switching elements,
wherein the at least one common supply unit has at least one line that is routed from the at least one inductive switching element to one of the at least two longitudinal antenna rods over, under, or over and under at least one of the antenna ferrules, and
wherein the at least one line inside the one longitudinal antenna rod branches off ahead of an end section containing the at least one further switching element to the common supply unit.

17. The magnetic resonance antenna as claimed in claim 2, wherein the plurality of radio-frequency switching elements is arranged at only one end section of the parallel-running longitudinal antenna rods, and
wherein the one end section is arranged on the parallel-running longitudinal antenna rods facing a first antenna ferrule.

18. The magnetic resonance antenna as claimed in claim 2, wherein at least one common supply unit is provided for supplying, controlling, or supplying and controlling radio-frequency switching elements of at least two of the parallel-running longitudinal antenna rods, the plurality of radio-frequency switching elements comprising the radio-frequency switching elements.

19. A magnetic resonance device comprising:
a magnetic resonance antenna comprising:
parallel-running longitudinal antenna rods arranged in a birdcage structure;
antenna ferrules connecting the parallel-running longitudinal antenna rods at ends of the parallel-running longitudinal antenna rods in radio frequency terms; and
a plurality of radio-frequency switching elements configured to interrupt at least a part of the parallel-running longitudinal antenna rods to detune a natural resonance frequency with respect to an operating magnetic resonance frequency in radio frequency terms,
wherein one or more radio-frequency switching elements of the plurality of radio-frequency switching elements are arranged at end sections of the parallel-running longitudinal antenna rods.

20. A positron emission tomography (PET) and magnetic resonance device comprising:
a magnetic resonance antenna comprising:
parallel-running longitudinal antenna rods arranged in a birdcage structure;
antenna ferrules connecting the parallel-running longitudinal antenna rods at ends of the parallel-running longitudinal antenna rods in radio frequency terms; and
a plurality of radio-frequency switching elements configured to interrupt at least a part of the parallel-running longitudinal antenna rods to detune a natural resonance frequency with respect to an operating magnetic resonance frequency in radio frequency terms,
wherein one or more radio-frequency switching elements of the plurality of radio-frequency switching elements are arranged at end sections of the parallel-running longitudinal antenna rods.

* * * * *